United States Patent [19]

Agard et al.

[11] 4,131,933

[45] Dec. 26, 1978

[54] QUICK DISCONNECT CARD-ON-BOARD ELECTRONIC PACKAGE ASSEMBLY

[75] Inventors: Richard L. Agard; Terrence E. Bocinski, both of Binghamton; Lawrence E. Brearley, Apalachin; William R. Yaple, Endwell, all of N.Y.

[73] Assignee: International Business Machines Corporation, Armonk, N.Y.

[21] Appl. No.: 792,153

[22] Filed: Apr. 29, 1977

[51] Int. Cl.$^2$ .............................................. H02B 1/02
[52] U.S. Cl. .................................. 361/415; 339/92 M
[58] Field of Search ....................... 361/415, 391, 413; 339/92 M, 17 LC

[56] References Cited

U.S. PATENT DOCUMENTS

| | | | |
|---|---|---|---|
| 2,746,022 | 5/1956 | Gilbert | 339/92 M |
| 2,953,767 | 9/1960 | Jackson et al. | 339/92 M |
| 3,198,991 | 8/1965 | Barnett | 361/415 |
| 3,260,982 | 7/1966 | Bostwick | 361/413 |
| 3,394,287 | 7/1968 | Zitzmann et al. | 361/391 |
| 3,474,387 | 10/1969 | Krum et al. | 339/92 M |
| 3,864,000 | 2/1975 | Coller et al. | 339/17 LC |
| 4,030,792 | 6/1977 | Fuerst | 339/17 LC |

FOREIGN PATENT DOCUMENTS 1392470   4/1975   United Kingdom ..................... 361/415

*Primary Examiner*—David Smith, Jr.
*Attorney, Agent, or Firm*—Gerald R. Gugger

[57] ABSTRACT

A card-on-board package assembly which comprises a printed circuit board, a board stiffener secured to the board, a card guide assembly fastened to the stiffener, and a plurality of printed circuit cards mounted in the guide assembly to make electrical contact with the board. The cards latch into position in the guide assembly and are connected into the board with a scissors-type movement by captive fastening means which fasten the cards to the stiffener. Individual cards may be easily replaced. The board, board stiffener, card guide, and card assembly is fastened to a gate or frame by captive fastening means and may be quickly and easily removed as a unit and replaced with another one.

1 Claim, 5 Drawing Figures

QUICK DISCONNECT CARD-ON-BOARD ELECTRONIC PACKAGE ASSEMBLY

BACKGROUND OF THE INVENTION

Heretofore it has been difficult and time-consuming to repair or replace card-on-board units in the field. For example, in the Monolithic System Technology card-on-board package used in the IBM 370 System, which is described in the IBM Maintenance Library Manual SY22-6739-5, Copyright 1969, the printed circuit board and printed circuit cards could not be removed as an entire unit. The cards had to be removed first from the card guidance system, then the card guidance system dis-assembled and removed from the board assembly. As the cards were removed, they had to be placed in the card container in proper sequence to maintain the sequence when re-plugging into a new board assembly. To remove the board, it was necessary to first remove the cards and then disassemble the guide frame from the board assembly. A multitude of screws were involved some of which oftentimes would fall into the unit. Additionally, a mass of I/O (input-output) wires had to be individually disconnected. It would take from 8-10 hours to remove and re-install a board in its supporting structure.

To actually repair or change the board in the field involved a tedious time-consuming task. Overflow and engineering change wires were either wire wrapped or clipped to the back of the board. To make a change or repair, it was generally necessary to remove a plurality of these overflow and/or engineering change wires and, in addition, they had to be individually tagged so that they could be reinstalled into their proper position. If the field engineer could not repair the board, it would have to be removed and sent back to the factory. In either event, the customer was faced with an undesirable excessive amount of machine downtime.

Also, present day technology has dictated that the overflow and engineering change wiring be permanently bonded to the circuit boards to improve electrical performance. Due to the small wires and density now used, engineering changes cannot be made in the field without the use of sophisticated equipment to perform deletions and wire additions resulting in an expensive operation. It became evident that an improved card-on-board package assembly was needed which could be quickly removed and replaced in the field.

SUMMARY OF THE INVENTION

The present invention makes use of a quick disconnect concept in the design of all of the removable units required in the card-on-board package, such as, the frame, the board/stiffener assembly, the card guide unit, the actuation/de-actuation scheme for the cards, and the pluggable signal I/O groupers and power plugs.

A feature of the present improved package lies in the ability to remove the board/stiffener assembly including the cards and card guide support frame through an opening in the back of a frame or gate as a unit after the signal I/O groupers, power plugs and special voltage housings are disconnected. The front of the printed circuit board is cemented in a recessed area on the back of the board stiffener. Through openings are provided around the periphery of the stiffener to receive signal I/O groupers and power plugs which plug into the circuit board. On the front side of the board stiffener are a plurality of channel openings adapted to receive the pluggable edge of the cards. Along the bottom of each channel is a contact housing strip having perforations which are in alignment with spring contacts on the circuit board and these perforations receive blade contacts on the pluggable edge of the card allowing them to plug into the spring contacts.

Fastened to the front of the board stiffener is a card guide support frame provided with guide grooves into which the cards mounted in card holders are inserted and guided into the proper plugging position in the channels. Around the periphery of the board stiffener are a plurality of screws which are held captive to the board stiffener by clips. These captive screws screw into tapped holes in the frame which facilitates quick and easy removal or attachment of the card-on-board assembly as a unit. This arrangement allows for removal of the assembly with the cards retained in their proper location and the assembly can be easily transferred to another piece of equipment. Also, the cards may be removed and re-installed on a bench away from the machine. Additionally, time is saved because it is not necessary to completely remove and completely insert and screw back in the captive held screws. This prevents the screws from being dropped or lost. The time required to remove and install the same or a different card-on-board assembly in the frame was reduced to approximately 1 hour.

The present invention further includes a unique card actuation and retention arrangement. Each printed circuit card is mounted in a card holder and each card holder is provided with a pair of notched bendable tabs which coact with projections in the card guide grooves to retain inserted cards in the proper plugging position during actual plugging of the cards into the board. The actual plugging of the cards is carried out with a scissors-type action by means of a screw at the top and bottom of each card housing and these screws are captively held in the card housings. Tapped holes for these screws are provided at the top and bottom of the channels in the board stiffener. To plug a card, first one screw is tightened and then the other one so that the card contacts progressively slide into the spring contacts on the board rather than all of them going in straight at once. This action allows the plugging of many more contacts and reduces contact wear and breakage. Also, the screws provide a positive retention of the cards to the stiffener. To remove cards, the screws are simply loosened.

Accordingly, a primary object of the present invention is to provide a novel and improved card-on-board electronic package assembly which can be quickly disconnected from or attached to a frame or gate as a unit.

A further object of the present invention is to provide a novel and improved card-on-board electronic package assembly which is removably attached as a unit to a frame or gate by captive fastening means.

A still further object of the present invention is to provide a novel and improved printed circuit board and printed circuit cards package assembly which is removably attached as a unit to a frame or gate by captive fastening means and the printed circuit cards are removably attached to the package assembly by captive fastening means.

Another object of the present invention is to provide a novel and improved printed circuit board and pluggable printed circuit cards package assembly wherein said cards are actuated into plugging contact with said board by a scissors-type action.

A further object of the present invention is to provide a card-on-board electronic package assembly which comprises a printed circuit board, a board stiffener, a card guide frame, and a plurality of printed circuit cards, said assembly being capable of quick removal and re-installation as a unit in a gate or frame.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
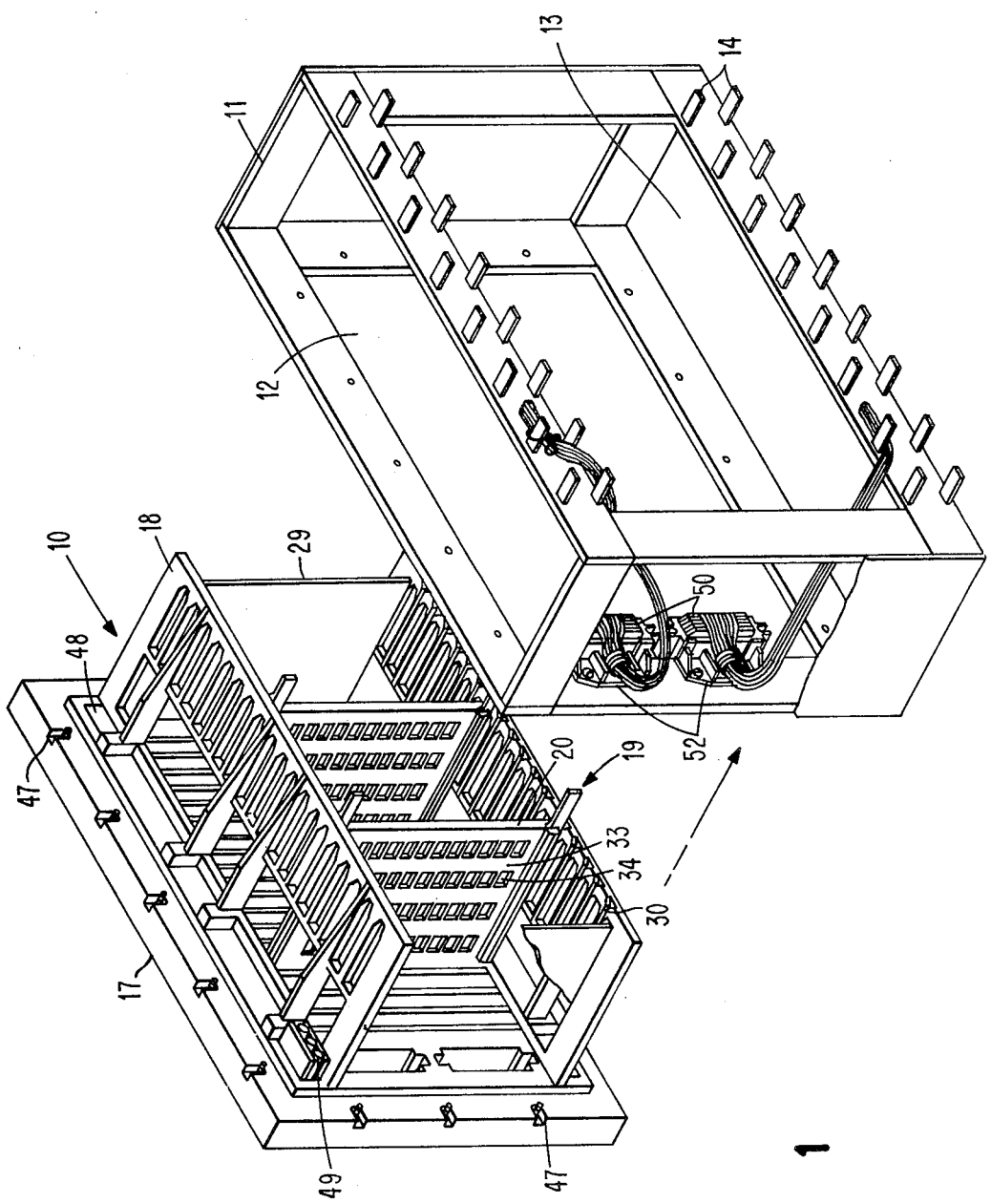
FIG. 1 is a diagrammatic view showing the card-on-board package assembly removed from the gate or frame.

FIG. 1 shows diagrammatically the card-on-board assembly 10 removed from a gate or frame assembly 11. The gate 11 has a back opening 12 for receiving the assembly and a front opening 13 for access to the assembly. Across the top and bottom of the front of the gate are a plurality of tabs 14 which form a raceway for cables 15. The card-on-board assembly comprises in general a printed circuit board 16 (FIGS. 2 and 3), a board stiffener 17, a card guide frame 18, and a plurality of card holders 19 each containing a printed circuit card 20.

Figure 2:
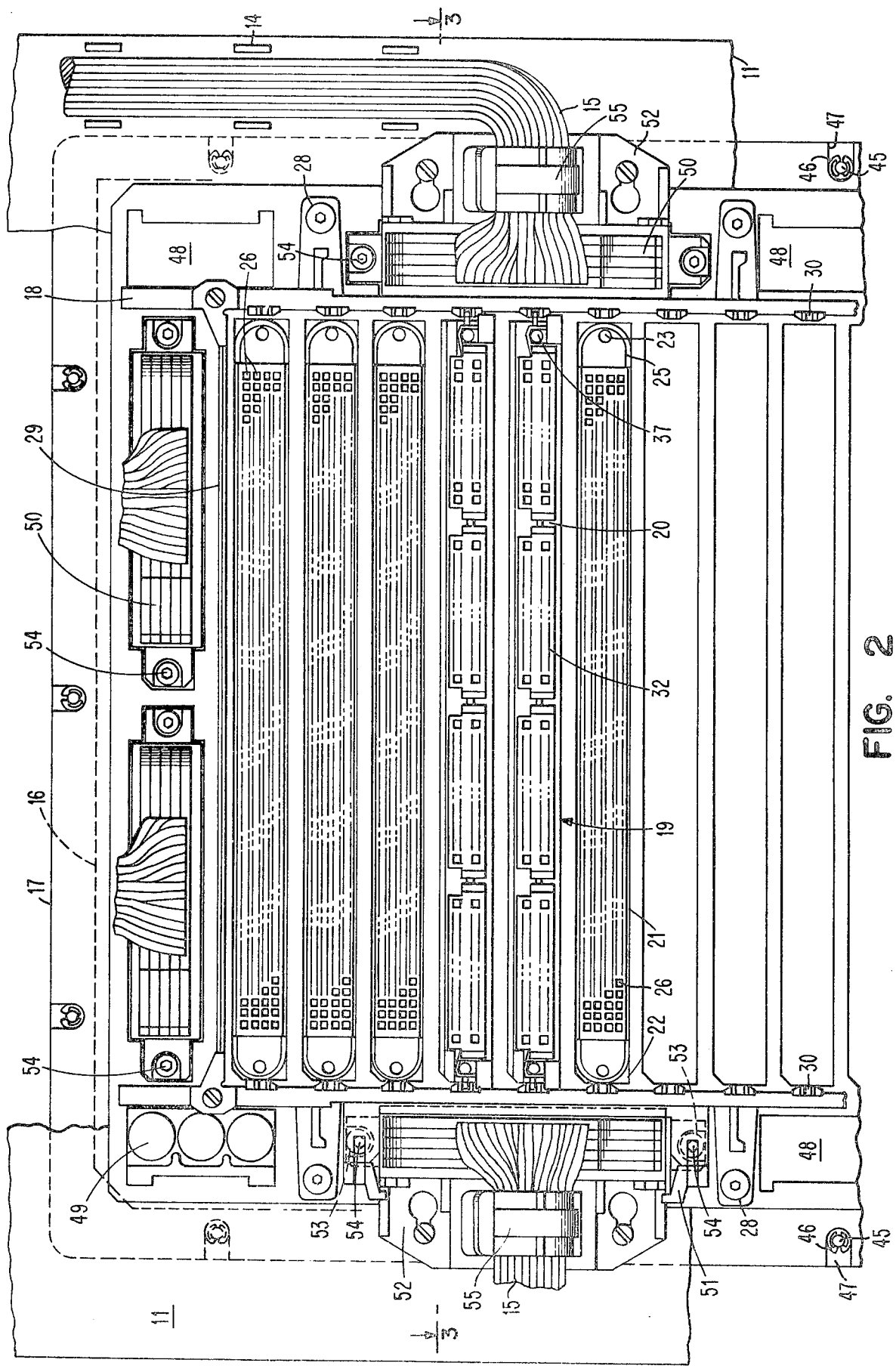
FIG. 2 is a partial view showing the front right half of the card-on-board assembly.
Figure 3:
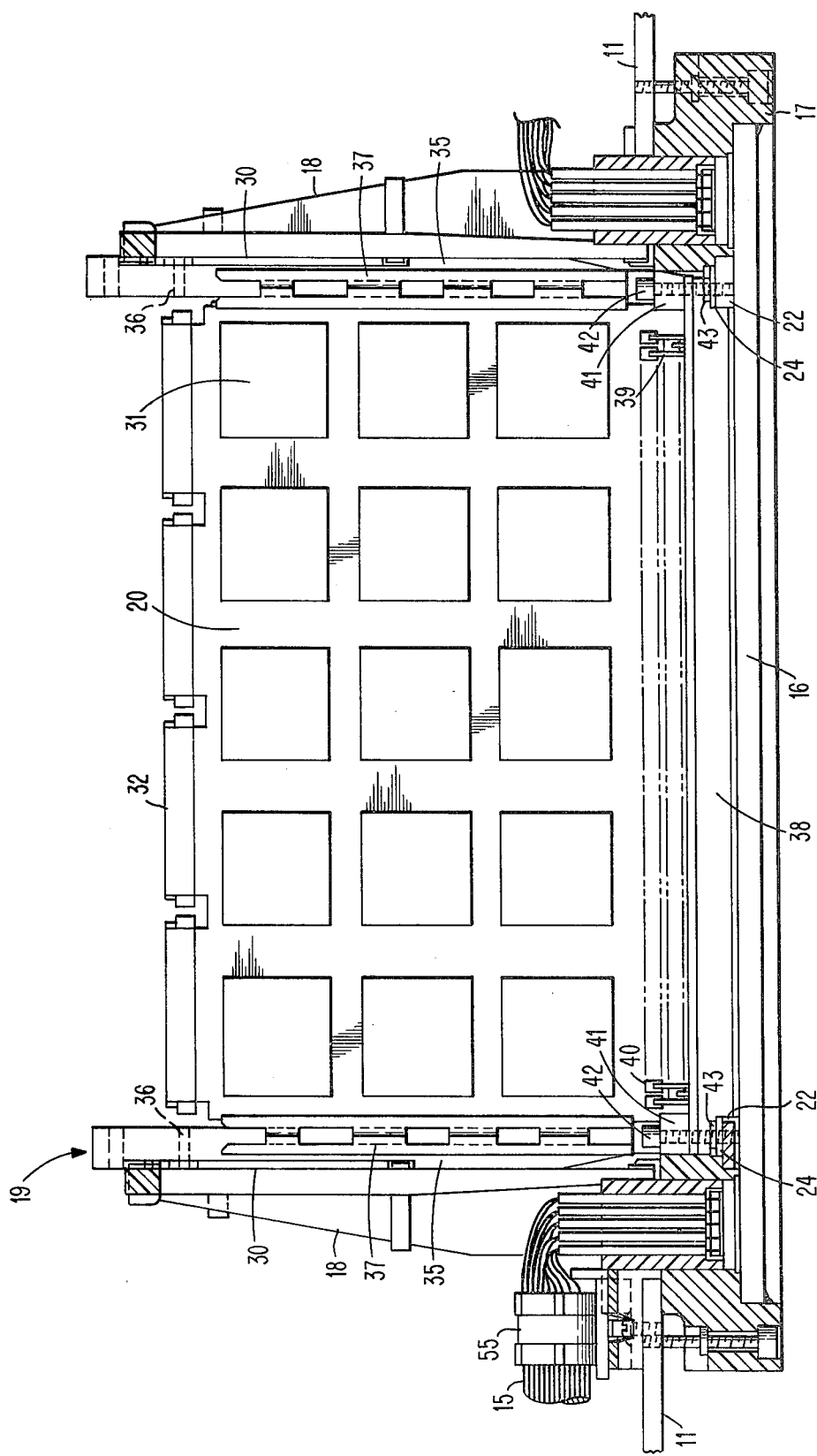
FIG. 3 is a sectional view taken on line 3—3 of FIG. 2 showing a printed circuit card and card holder.
Figure 4:
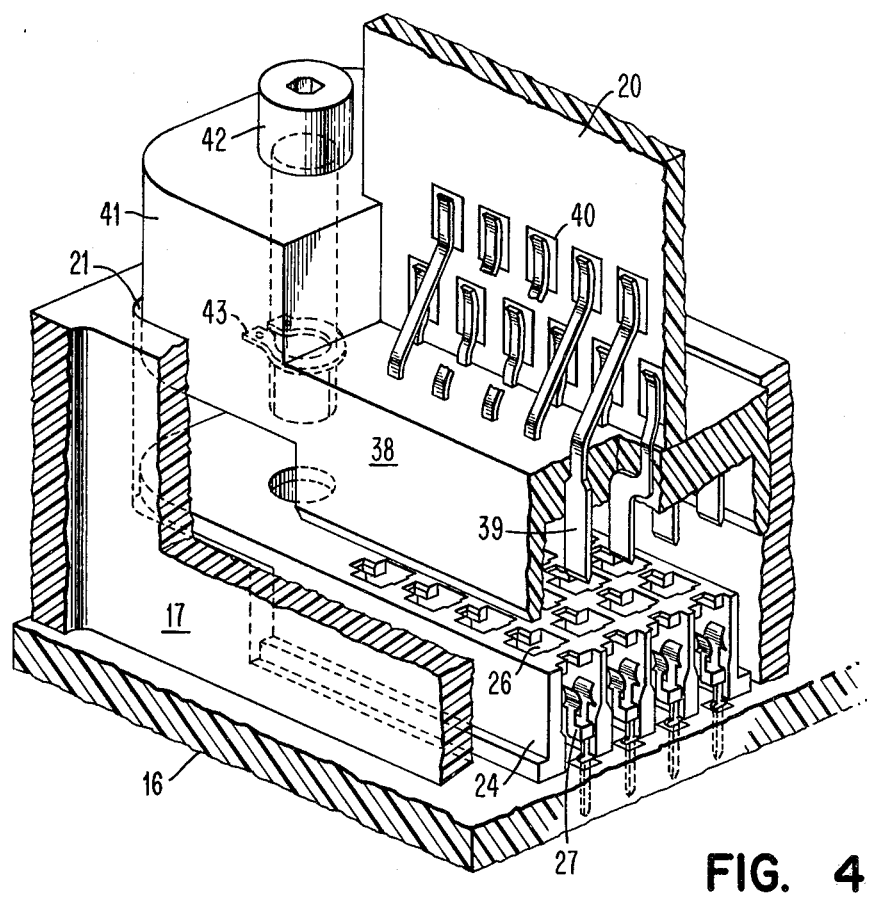
FIG. 4 is a partial isometric view showing the circuit card blade contacts and the circuit board spring contacts.

Referring now to FIGS. 2, 3 and 4, FIG. 2 shows only the right front half of the card-on-board assembly 10 since the other half is similar. The printed circuit board 16 is bonded in a recess in the back of the non-metallic board stiffener 17. Spaced across the board stiffener is a series of 18 elongated channel openings 21 which extend in a vertical direction and which permits communication with the front of the printed circuit board. Extending horizontally across the board stiffener and overlying the ends of the channel openings are two metal retainer bars 22 which are bonded to the board stiffener and which have a series of tapped holes 23 arranged so that there is a tapped hole in each end of the channel openings. Mounted inside of each channel opening is a spring contact housing 24. The contact housings are supported by the retainer bars 22 and are retained thereon by means of C-clips 25 which snap into grooves in the sides of the channel openings. As shown in FIG. 4, the contact housings 24 have a plurality of guide holes 26 which are in alignment with bifurcated spring contacts 27 mounted in the front side of the printed circuit board 16. Fastened to the front of the board stiffener by means of 8 screws 28 is the card guide frame 18 which comprises a baffle plate 29 at each end and a series of 18 guide grooves 30 across both the top and bottom of the frame. The grooves are arranged to guide the edges of the cards so that the pluggable ends of inserted cards enter into their respective channels 21.

Referring to FIG. 3, there is shown one of the card holders 19 and printed circuit cards 20 mounted in the card guide frame 18. A plurality of components 31 are attached to the side of the card shown and along one edge of the card are cross-over connectors 32 which are used to make electrical connections between cards. The card holder is plastic and comprises a panel 33 (FIG. 1) having a plurality of openings 34 which aid in cooling the card. Formed along the top and bottom edges of the panel are guide rails 35 (FIG. 3) which guide the holder into the guide grooves 30 at the top and bottom of the frame 18. The outboard end of each guide rail has a latch projection 36 which coacts with the guide grooves 30 to properly locate the inserted card holders, in a manner to be described. Within each guide rail is a hollow tool guide portion 37.

The printed circuit card 20 fits into grooves in the card holder and it is retained in the holder by a pair of latching tabs (not shown). Connected along the pluggable edge of the card is a plastic contact housing 38 in which are molded, for example, 4 rows of blade contacts 39, as shown in FIG. 4. Each blade contact is soldered to a land 40 on the card. Formed at each end of the contact housing is a block portion 41 having a hole in which is mounted a hex socket head screw 42. These screws have a retainer clip 43 attached to them to hold them captive to the card. The retainer clips ride in a recessed area underneath the block portions 41. The captive screws are in alignment with the tool guide portions 37.

The captive screws 42 thread into the tapped holes 23 in the retainer bars 22 which extend across the top and bottom of the stiffener board. The card is designed to be actuated and plugged into the circuit board by completely tightening the captive screws one at a time with a special torque drive tool (not shown) with a hex end which fits the socket in the screws. The tool is inserted into and guided by the hollow tool guide portions 37 on the card holder.

This tightening action first on one end of the card and then on the other end has the advantage that the insertion forces acting against the circuit board are significantly reduced, as compared to a straight-in mode of actuation, since the card contact blades 39 are inserted into the spring contacts 27 on the board in a scissors-like manner. As a result, the first few blades are completely inserted while the remaining blades are only partially inserted to a gradually decreasing distance due to the higher initial frictional forces which must be overcome as the tapered ends of the contact blades 39 enter the insertion ramps provided on the upper ends of the board contacts 27. This reaction tends to lift the opposite end of the card and its actuation screw above the retainer bars so that the screw threads will not mate with the threads in the bar without exerting considerable pressure on the actuation tool. This would make actuation difficult and to eliminate this problem, the latch projections 36 were designed in the outboard ends of the guide rails 35 on the card holder.

Figure 5:
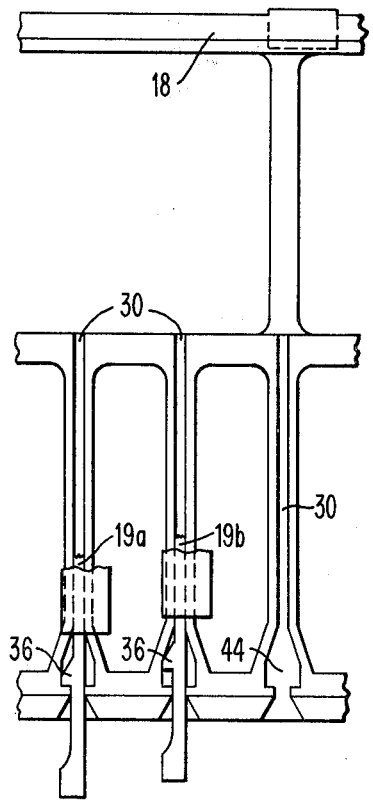
FIG. 5 is a partial view showing three guide grooves in the card guide frame and the arrangement for latching the card holders.

FIG. 5 is a partial view looking down on three of the guide grooves 30 on the bottom of the card guide frame. All of the grooves across the top and bottom of the frame are identical and they have at the front or card insertion end a latching recess 44. When the card holders and cards are inserted into the grooves 30 in the card guide frame, they are pushed toward the printed circuit board until the latch projections 36 snap into the recesses 44, as illustrated by the card holder 19a. The distance of the latch and recess is established at the correct distance from the pluggable surface of the circuit board so that when the latches engage, the printed circuit card is held in proper position in alignment with the spring contacts in the board and parallel to the board. In this position, the blade contacts just enter the holes in the spring contact housing 24. Now the captive screws 42 in the holder are tightened, one at a time, and the end of the holder opposite the end being tightened will not lift and the screws will enter the threads in the retainer bars correctly. When the screws are fully tightened, the latch projections 36 on the holder will be in the position illustrated by the holder 19b in FIG. 5 and the card blade contacts will be fully seated in the spring contacts of the circuit board.

Unplugging and removal of the circuit is accomplished by loosening the screw in either end of the card and this action raises the screw retainer clip 43 until it bears against the bottom surface of the block portion 41 and this lifts the blade contacts out of the spring contacts as the screw is loosened. The same procedure is employed for the other screw and the card is free of the contacts. The latch projections 36 are then released from the groove recesses by pushing the outboard ends of the card holder guide rails and the card can then be removed.

The scissors-like insertion action provided by first fully seating one end of the card and then the other is unique since it permits insertion of more than four times as many contacts as are employed in present hand inserted card contact systems. In addition, the positive retention of the card to the board stiffener and added rigidity provided by the captive screws eliminates card walk-out and greatly reduces the contact motion observed in present contact systems under field vibratory conditions. Reduction of contact motion is most important since tests have shown that relative motion of one contact member on the other will result in wear through of the precious metals employed on the mating contact surfaces which seriously affects the long term reliability of the contact system.

Referring to FIG. 2, arranged around the perimeter of the stiffener board are 16 hex socket head screws 45. These screws have a retainer clip 46 attached to them to hold them captive to the board stiffener. The retainer clips ride in recesses 47 in the board stiffener. Tapped holes are provided around the back of the gate or frame 11 to receive these screws. The previously mentioned torque drive tool is used to actuate the screws and it can be seen that the circuit board/stiffener board/card guide frame and circuit card assembly can be easily and quickly inserted into the frame and attached thereto or removed from the frame and replaced by another similar assembly.

In the board stiffener 17, there are 3 openings 48 across the top and 3 across the bottom which permit the plugging of 6 capacitor packages 49 into the circuit board. Also arranged around the perimeter of the board stiffener are 8 openings which receive 8 I/O wire groupers 50 which plug into the circuit board. Each wire grouper is mounted in a holder 51 which fits over a wire clip mounting plate 52 which is screwed to the frame or gate 11. Each grouper holder 51 has formed thereon a pair of hollow tool guide portions 53 which are in alignment with hex socket head screws 54 held captive in the grouper by retainer clips. Metal plates, not shown, are bonded to the board stiffener and have tapped holes to receive these screws. The cables 15 coming out of each grouper are supported by a clip or clamp 55 fastened to their mounting plates 52 and the wires are threaded between the tabs 14 on the frame. The previously mentioned torque drive tool is inserted in the guide portions 53 and used to loosen the captive screws to disconnect the groupers from the board stiffener prior to removing the card-on-board assembly from the frame. The torque drive tool is also used to connect the grouper by tightening the captive screws one at a time whereby contact tabs on the groupers will seat into the spring contacts on the circuit board with the same scissors-like insertion action as occurs with the cards.

As was previously mentioned, in present-day technology the repair or changing of circuit board wiring in the field is too costly and time-consuming. The present card-on-board package assembly overcomes this problem because the circuit cards and circuit boards with their stiffeners can be stocked in the field which enables the field engineer to change cards and boards in the field by simply and quickly replacing them.

While the invention has been particularly shown and described with reference to a preferred embodiment thereof, it will be understood by those skilled in the art that various changes in form and details may be made therein without departing from the spirit and scope of the invention.

What is claimed is:

1. A card-on-board electronic package assembly which comprises:

a printed circuit board having a plurality of spring contacts arranged on a surface thereof;

a board stiffener fastened to said circuit board and having a plurality of channels with each channel provided with a contact housing having holes in alignment with contacts on said board;

a plurality of printed circuit cards each having a plurality of blade contacts along one edge and each card being mounted in a card holder;

a card guide frame having a plurality of grooves across the top and bottom for receiving said card holders and cards and guiding the blade contact edges of inserted cards into said channels and contact housings;

captive fastening means associated with each card comprising a screw mounted at the top and bottom of the card with each screw having a retainer clip attached thereto, said screws being effective when tightened one at a time to secure inserted cards to said board stiffener with their blade contacts in engagement with the board spring contacts and operable when loosened to disconnect secured cards from said board stiffener for removal;

a latching tab provided on the top and bottom edge of each card holder and the top and bottom grooves in the card guide frame each have a recessed portion which coact with said tabs to latch inserted card holders against vertical movement and prevent either the top or bottom edge of the cards from lifting when the opposite edge is tightened.

* * * * *